(12) United States Patent
Oppelt

(10) Patent No.: US 6,838,936 B2
(45) Date of Patent: Jan. 4, 2005

(54) LOW-NOISE AMPLIFIER DEVICE HAVING NEGATIVE FEEDBACK VIA A CONTROLLED CURRENT SOURCE, AND METHOD OF USING THE AMPLIFIER DEVICE

(75) Inventor: Ralph Oppelt, Uttenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/424,509

(22) Filed: Apr. 28, 2003

(65) Prior Publication Data

US 2003/0234684 A1 Dec. 25, 2003

Related U.S. Application Data

(63) Continuation-in-part of application No. 09/672,630, filed on Sep. 28, 2000, now Pat. No. 6,580,317.

(30) Foreign Application Priority Data

Sep. 28, 1999 (DE) .......................................... 199 46 459

(51) Int. Cl.[7] .............................................. H03F 1/36
(52) U.S. Cl. ...................................... 330/110; 330/69
(58) Field of Search ............................ 330/110, 82, 83, 330/85, 86, 69, 102, 103, 174

(56) References Cited

U.S. PATENT DOCUMENTS

| 3,624,536 | A | | 11/1971 | Norton |
| 3,968,431 | A | * | 7/1976 | Ekstrom ................... 324/76.66 |
| 4,185,249 | A | * | 1/1980 | McKim et al. ................ 330/85 |
| 4,641,063 | A | * | 2/1987 | Smushkovich ............... 315/383 |
| 6,172,561 | B1 | | 1/2001 | Schott |
| 6,323,730 | B1 | | 11/2001 | Hynd |
| 6,459,265 | B1 | | 10/2002 | Lou et al. |

OTHER PUBLICATIONS

Tietze/Schenk: "Electronic Circuits Design and Applications", Springer verlag, translation of $9^{th}$ ed. pp. 40–44 and 118–123.

* cited by examiner

*Primary Examiner*—Henry Choe
(74) *Attorney, Agent, or Firm*—Laurence A. Greenberg; Werner H. Stemer; Ralph E. Locher

(57) ABSTRACT

The amplifier device contains a first amplifier element having a first input and a first output. The first output is fed back via a negative feedback path to the input. The negative feedback path contains a controlled current source which brings about a reduction in the noise and also a real finite input impedance.

15 Claims, 7 Drawing Sheets

LOW-NOISE AMPLIFIER DEVICE HAVING NEGATIVE FEEDBACK VIA A CONTROLLED CURRENT SOURCE, AND METHOD OF USING THE AMPLIFIER DEVICE

CROSS-REFERENCE TO RELATED APPLICATION

This is a continuation-in-part application of U.S. application Ser. No. 09/672,630, filed Sep. 28, 2000 now U.S. Pat. No. 6,580,317.

BACKGROUND OF THE INVENTION

Field of the Invention

The invention relates to a low-noise amplifier device having at least a first amplifier element having negative feedback. The invention additionally relates to the use of the amplifier device.

Such an amplifier device is employed for example as an amplifier of an ultrasonic apparatus, magnetic resonance apparatus or of a radio-frequency measuring apparatus. In the amplifier device, an electrical signal which, for example, is generated by an ultrasonic transducer from a received acoustic signal and, in particular, may have a very low signal level is in this case amplified for subsequent signal processing (not specifically described here). To ensure that the information content is not diminished unnecessarily this amplification should be effected with as little noise as possible.

The reference book by Tietze and Schenk, *Halbleiter-Schaltungstechnik*, Springer-Verlag, $9^{th}$ ed., 1991, pages 44–49 and 132–137 (see Tietze and Schenk, *Electronic Circuits: Design and Applications*, Springer-Verlag, translation of the $9^{th}$ ed., pages 40–44 and 118–123) discloses various amplifier devices which contain, in addition to at least one active amplifier element, such as a transistor or an operational amplifier, at least one further element for connecting up the amplifier element. In order to eliminate the nonlinearity of the active element and, in particular, also to set a defined gain and input impedance, use is often made here of the circuit principle of negative feedback.

The negative feedback is usually effected via a non-reactive resistor. However, since a non-reactive resistor generates thermal noise, the originally good noise properties of the active amplifier element are significantly impaired by the resistive negative feedback.

In order to avoid this negative effect of resistive negative feedback, inductive transformer-based negative feedback is provided instead in the case of the amplifier devices respectively described in the *Company catalog of Adams-Russell Co. Inc. "RF&Microwave Signal Processing Components"* in the section "Amplifier Application Note" on pages 20 and 21 and in U.S. Pat. No. 3,624,536. A very good noise behavior can thus also be achieved for the amplifier device overall, since a transformer is a very low-loss and low-noise element. However, a transformer is relatively expensive and also rather large, so that it can only be integrated with difficulty.

The technical paper *"Rauscharme Verstärkerschaltung"* [*Low-noise amplifier circuit*], Neues aus der Technik, 1979, No. 3, 15, Jun. 1979, p. 2 describes a low-noise amplifier device in which the output of an amplifier element is fed back via a first and a second negative feedback path to the two inputs. One negative feedback path contains a resistor and the other a voltage-controlled voltage source. An inverting differential amplifier is thus produced overall which has an improved noise behavior compared with an inverting differential amplifier connected up in a conventional manner. However, the resistor in the first negative feedback path still supplies a finite contribution to the total noise of the amplifier device. This is because the input of the amplifier device is connected up directly to the resistor.

Moreover, German patent DE 40 24 166 C1 discloses an amplifier device having capacitive negative feedback which is likewise distinguished by a good noise behavior. This is because the capacitors used in this case also have very little noise. What is unfavorable, by contrast, is that the gain of the disclosed amplifier device having capacitive and negative feedback is greatly dependent on the frequency and on the load.

However, an amplifier device having a high bandwidth is favorable precisely when used in an ultrasonic apparatus, owing to the requirements of being able to connect different ultrasonic transducers, in particular those having center frequencies that differ from one another. The required bandwidth may in this case be of the order of magnitude of at least two decades.

Furthermore, the known amplifier devices often have a very high and occasionally also an undefined input impedance. The input impedance is typically at least $10^4 \Omega$. This has an unfavorable effect with regard to power matching of the amplifier device to a source resistance of the ultrasonic transducer connected to the input. This source resistance is of the order of magnitude of a few $10\Omega$. If appropriate, the connected ultrasonic transducer may also be provided with a simple matching circuit which transforms the source resistance to a standard value of e.g. $200\Omega$. However, this value is significantly below the value which is customary for the input impedance of the known amplifier devices. Apart from the power transfer which is not optimum in that case, the high or undefined input impedance can additionally also lead to a deterioration in the noise behavior. Furthermore, standing wave effects can occur, leading to undesirable distortion.

U.S. Pat. No. 6,459,265 B1 describes an amplifier device which is intended to be used as a preamplifier with reduced input impedance in a magnetic resonance apparatus. An amplifier element designed as a GaAs field-effect transistor (FET) and having a capacitive negative feedback is provided.

SUMMARY OF THE INVENTION

It is accordingly an object of the invention to provide a low-noise amplifier device with negative feedback via a controlled current source and an implementation of the amplifier device which overcomes the above-mentioned disadvantages of the heretofore-known devices and methods of this general type and which provides for an amplifier device which, in a wide frequency range, has a gain that is as independent of frequency as possible and which also has a defined real input impedance. It is a further object to provide an amplifier device with as little noise as possible and for it to be readily integrable. In particular, the object is also to eliminate the noise contribution of the negative feedback.

With the foregoing and other objects in view there is provided, in accordance with the invention, a low-noise amplifier device, comprising:

an amplifier element having at least one input and an output;
a negative feedback path from the output to the input for receiving an input current fed into the amplifier device; and
a controlled current source connected in the negative feedback path.

In other words, the low-noise amplifier device according to the invention includes at least:
  a first amplifier element having at least a first input and also a first output, and
  a negative feedback path fed back from the first output to the first input,
  the negative feedback path being designed to take up an input current that is fed into the amplifier device, and containing a controlled current source.

In this case, the invention is based on the insight that, by means of a controlled current source in the negative feedback path, it is possible both for the noise contribution to be reduced and for a real finite input impedance to be set. What has a particularly favorable effect in this case is that the setting of the real finite input impedance does not require an additional non-reactive resistor, the thermal noise of which would result in the noise behavior of the entire amplifier device also being impaired. Specifically, the controlled current source in the first negative feedback path has the effect that a virtual input impedance having a real and finite value forms at the input of the amplifier device. In particular, this does not require a resistive connection in parallel with the input of the amplifier device. The advantage of matching to the source resistance of a unit, for example an ultrasonic transducer, connected upstream of the amplifier device is thus accompanied by an improvement in the noise behavior.

Without any restriction to the general validity, the effect of the controlled current source in the first negative feedback path will first be explained for the case where the first amplifier element having negative feedback via the second negative feedback path is an operational amplifier connected up in a non-inverting fashion. The two negative feedback paths are specifically described and claimed in the parent application Ser. No. 09/672,630. The ideally infinite input impedance of the non-inverting operational amplifier can now be transferred by the controlled current source into an input impedance having a finite and real value. Specifically, the controlled current source converts the output voltage of the amplifier device into a current which appears, at the input of the amplifier device, as an input current which is proportional to the output voltage. On account of the proportional relationship—determined by the gain—between the input voltage and the output voltage, a proportional relationship between the input current and the input voltage thus also results, that is to say a finite real input resistance.

Instead of the voltage-controlled current source used in the exemplary embodiment described above, however, it is equally possible to use a current-controlled current source. To that end, by way of example, a portion of the output voltage which is to be fed back in the manner of negative feedback is converted into a proportional current signal, which then serves as a control variable. Irrespective of the nature of its respective control, the current source can be embodied, without difficulty, with the high bandwidth required for the amplifier device.

The bandwidth of the amplifier device is otherwise determined principally by the first amplifier element, which, in particular, may be designed as a broadband transistor or operational amplifier. In the last-mentioned case, an embodiment is possible in the form of a component integrated on a chip or alternatively in the form of a discrete structure having a plurality of individual components. However, a bandwidth of at least two frequency decades can readily be realized in each embodiment.

In accordance with an added feature of the invention, the current source is voltage-controlled. As already described above, this makes it possible, in a particularly simple manner, for an output voltage of a non-inverting operational amplifier to be converted into a finite input current of the amplifier device.

A further embodiment variant, in which the negative feedback path also contains a first voltage divider in addition to the controlled current source, is advantageous. Specifically, that portion of the current supplied by the controlled current source which appears at the input of the amplifier device can be set with the aid of said first voltage divider. The voltage divider also simultaneously serves as a current divider. The desired value for the real input impedance of the amplifier device can then be set very accurately by way of the divider ratio. It is particularly favorable if the first voltage divider comprises at least a series circuit formed by a first and a second divider capacitor, since the divider capacitors do not generate thermal noise comparable to that of a non-reactive resistor. The frequency dependence of the two divider capacitors is not manifested on account of the behavior determined exclusively by the division ratio, so that practically no concessions at all result in the bandwidth which can be attained.

In an embodiment which is described and claimed in the parent application Ser. No. 09/672,630, the second negative feedback path contains a second voltage divider, which sets the gain of the amplifier device independently of the optionally non-linear properties of the first amplifier element. The gain is determined exclusively by the ratio of the two impedances of the second voltage divider, said impedances being connected in series. One example of this is the operational amplifier connected up in a non-inverting fashion. A capacitively designed second voltage divider once again enables a particularly favorable noise behavior to be achieved. The second voltage divider then comprises at least a series circuit formed by a third and a fourth divider capacitor. In order to prevent undesirable charging at the second input, the third and the fourth divider capacitors or just one of the two divider capacitors mentioned may, if appropriate, also be bridged resistively. In this case, this bridging may have an arbitrarily high resistance. The bridging resistors that may be present are unimportant for the noise since they are short-circuited by the third and/or fourth divider capacitor in the signal frequency range of interest.

In a further embodiment, the current source is controlled by means of a current. A current-inverting negative impedance converter, which is also referred to as INIC, is provided, in particular, for this purpose. The leading "I" in this case denotes current inversion and the rest is an acronym for "Negative Impedance Converter." An INIC is particularly well suited for use in the first negative feedback path, specifically because a current flows both from the input and from the output of the amplifier device into the first negative feedback path. Therefore, it is precisely an element having current inversion that is required. A circuit which, apart from an inductive transformer—which is undesirable on account of its large physical form—is constructed only with passive components cannot offer this function.

In a further favorable variant which, again, is described and claimed in the parent application Ser. No. 09/672,630, the current-inverting negative impedance converter contains a second broadband amplifier element, for example again in the form of an operational amplifier. The broadband embodiment ensures that the amplifier device overall can be used in a wide frequency range. A second output is fed back in each case to a third and a fourth input of the second amplifier element. The favorable current-inverting effect of the negative impedance converter is thereby achieved. In another embodiment, the second negative feedback path contains a second voltage divider which, particularly when a current-inverting negative impedance converter is used in the first negative feedback path, may also be designed purely resistively with a series circuit formed by a first and second non-reactive divider resistor. The current-inverting negative impedance converter has the positive property of at least partly suppressing the noise contribution of the two non-reactive divider resistors. Moreover, the gain of the amplifier device can be set very accurately by means of the non-reactive divider resistors, which are also highly suitable for integration. An embodiment in which the non-reactive divider resistors have an identical resistance is particularly advantageous. This embodiment is distinguished by the fact that the noise contributions of the two divider resistors and the voltage noise of the first amplifier element are completely suppressed by the current-inverting negative impedance converter.

In a further embodiment, a finite real input impedance is produced which can be set by appropriate connection of the two negative feedback paths. A finite real input impedance of 10 ohms or of 200 ohms is particularly favorable precisely in the case of an ultrasonic transducer connected upstream of the amplifier device because the source impedance of the ultrasonic transducer has this value or can be transformed without difficulty to these resistance values. Reflection-free matching is thus achieved in conjunction with low inherent noise of the amplifier device.

Owing to the favorable noise behavior and the input impedance which can be adapted to a predetermined value of a source resistance, the amplifier device can be used particularly advantageously in an ultrasonic apparatus. It then serves, in particular, as a preamplifier which is matched to an ultrasonic transducer connected upstream and preamplifies an output signal of the ultrasonic transducer with particularly little noise for further processing. Use in a magnetic resonance apparatus or in a radio-frequency measuring apparatus is likewise possible. In these apparatuses, too, a good noise behavior and an adjustable real input impedance are favorable properties of a preamplifier that is used, particularly when these properties apply over a large frequency range, as in the case of the amplifier device.

With these and other objects in view there is also provided, therefore, in accordance with the invention, a method of using a low-noise amplifier, which comprises:

providing a low-noise amplifier device having:
    a first amplifier element having at least one input and an output;
    a negative feedback path from the output to the input for receiving an input current fed into the amplifier device; and
    a controlled current source connected in the negative feedback path; and
using the low-noise amplifier device to amplify a signal of an apparatus selected from the group consisting of an ultrasonic apparatus, a magnetic resonance apparatus, and a radio-frequency measuring apparatus.

Other features which are considered as characteristic for the invention are set forth in the appended claims.

Although the invention is illustrated and described herein as embodied in low-noise amplifier device having negative feedback via a controlled current source, and use of the amplifier device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
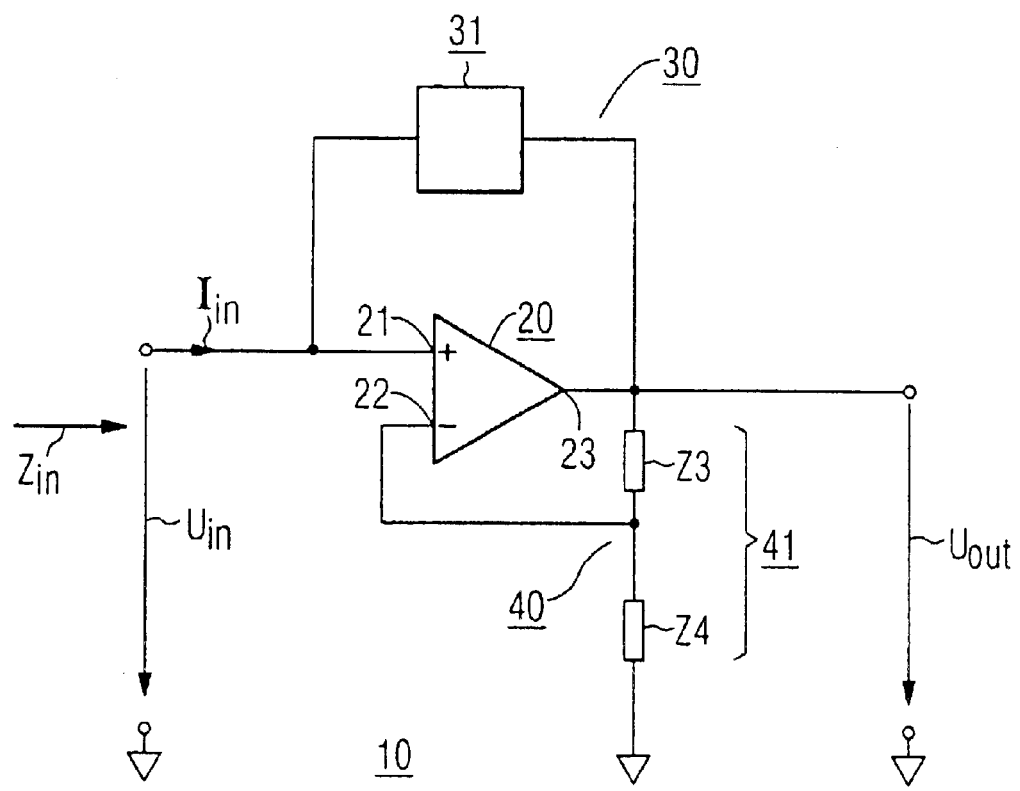
FIG. 1 shows an amplifier device having negative feedback via a controlled current source.

Referring now to the figures of the drawing in detail and first, particularly, to FIG. 1 thereof, there is shown an amplifier device 10 containing a first amplifier element 20 having a high bandwidth, said amplifier element having double negative feedback. In this case, the first amplifier element 20 is an operational amplifier having a first non-inverting input 21, a second inverting input 22 and a first output 23. The first output 23 is fed back via a first negative feedback path 30 and also via a second negative feedback path 40 to the first and second inputs 21 and 22, respectively. An input voltage present at the input of the amplifier device 10 is designated by $U_{in}$, an input current is designated by $I_{in}$, an input impedance of the amplifier device 10 is designated by $Z_{in}$ and an output voltage present at the output of the amplifier device 10 is designated by $U_{out}$. In this case, the first input 21 and the first output 23 of the first amplifier element 20 in each case also form the input and output, respectively, of the amplifier device 10.

The second negative feedback path 40 contains a voltage divider 41 comprising a series circuit formed by a first and a second divider impedance Z3 and Z4, respectively. A tap between the two divider impedances Z3 and Z4 is electrically conductively connected to the second input 22. This connection corresponds to the known non-inverting negative feedback of an operational amplifier. A gain V is then determined by the two divider impedances Z3 and Z4 as:

$$V = \frac{U_{out}}{U_{in}} = 1 + \frac{Z3}{Z4} \quad (1)$$

Without the first negative feedback path 30, the amplifier device 10 would have an input impedance $Z_{in}$ that would be infinite in the theoretical limiting case. Moreover, the two divider impedances Z3 and Z4 are usually designed as non-reactive divider resistors R3 and R4, respectively, with the result that the amplifier device 10 has a considerable inherent noise on account of the thermal noise of these two non-reactive divider resistors R3 and R4. Assuming that the negative feedback path 30 is not present, and that the two divider impedances Z3 and Z4 constitute purely non-reactive divider resistors R3 and R4, respectively, their results for the amplifier device 10 a noise factor F of $$F = 1 + \frac{p_n}{4kT}\left[\frac{r_n}{R_q} + \frac{R_q}{r_n}\left(1 + \frac{R34}{R_q}\right)^2\right] + \frac{R34}{R_q}, \quad (2)$$

where $p_n$ designates an equivalent noise input power density and $r_n$ designates an equivalent noise input resistance, which can be determined from known noise characteristic quantities (=equivalent input noise voltage density and input noise current density) of the first amplifier element 20. Furthermore, k denotes Boltzmann's constant, T denotes the ambient temperature, $R_q$ denotes a real source resistance of a unit connected upstream of the amplifier device 10 and $$R34 = \frac{R3 \cdot R4}{R3 + R4}$$

denotes a resistance that would result from R3 and R4 being connected in parallel.

The analysis of equation (2) reveals that the conditions $R34 \ll R_q$ and $r_n = R_q$ should be met for a noise factor F that is as small as possible. The second condition can be achieved by selecting or designing a first amplifier element 20 with a corresponding equivalent noise input resistance $r_n$. By contrast, very small non-reactive divider resistors R3 and R4 should be chosen for the first condition. However, this leads to a not inconsiderable current flow in the second negative feedback path 40, as a result of which the power demand of the amplifier device 10 and also the signal distortion in the output voltage $U_{out}$ then increase. Both are undesirable.

The first negative feedback path 30 therefore contains a controlled current source 31, which, on the one hand, sets a finite and real input impedance $Z_{in}$ and, on the other hand, at least reduces or even completely eliminates the noise contribution of the voltage divider 41 in the second negative feedback path 40. This is done, in particular, without the above-described negative accompanying phenomena, such as high power demand or high signal distortion.

Figure 2:
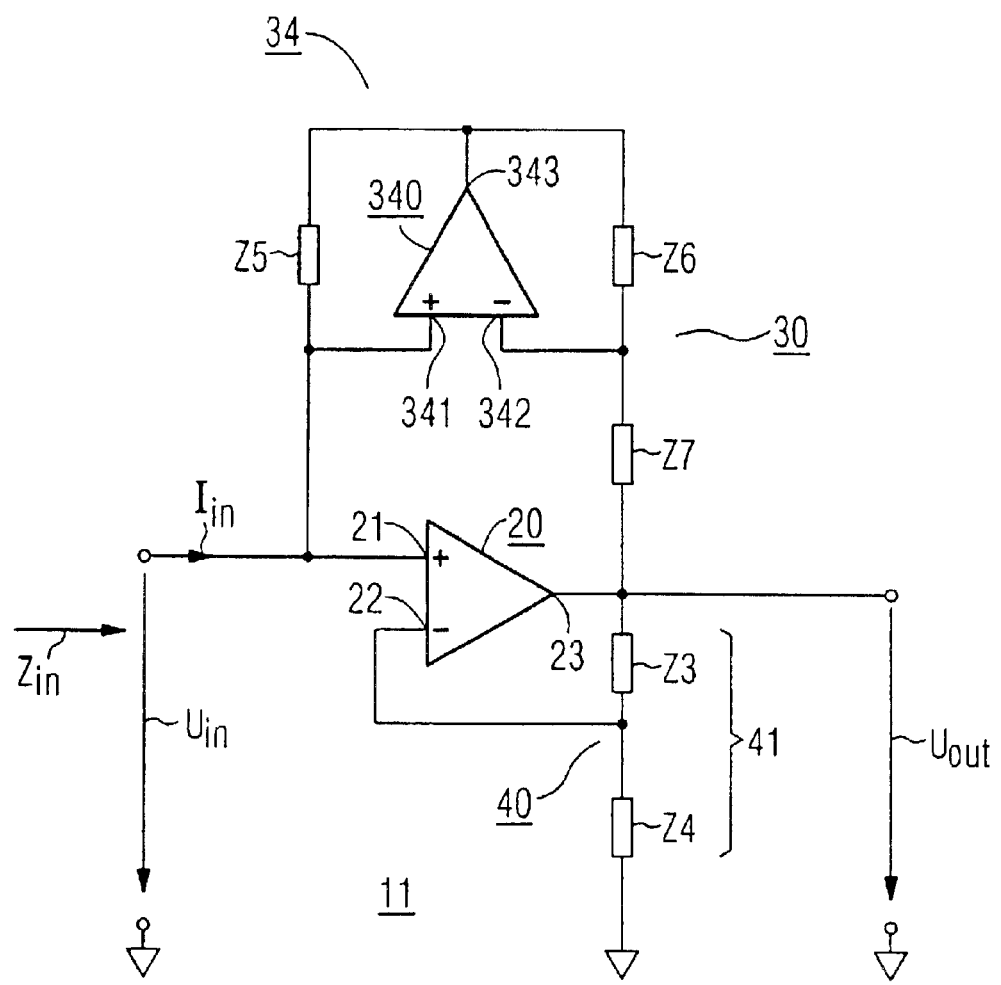
FIG. 2 shows an amplifier device having negative feedback via a current-inverting negative impedance converter.

FIG. 2 illustrates an amplifier device 11 containing a concrete embodiment of the controlled current source 31 shown in FIG. 1. This is a current-controlled current source in the form of a current-inverting negative impedance converter 34, which is also referred to by the abbreviation INIC. This current-inverting negative impedance converter 34 is composed of a likewise broadband second amplifier element 340 having a third and a fourth input 341 and 342, respectively, and also a second output 343. The second output 343 is fed back via a first INIC impedance Z5 to the third input 341 and via a second INIC impedance Z6 to the fourth input 342. The fourth input 342 is additionally connected to the first output 23 of the first amplifier element 20 via a third INIC impedance Z7.

The negative impedance converter 34 effects current inversion, so that a current can flow both from the input and from the output of the amplifier device 11 into the negative impedance converter 34. A finite input current $I_{in}$ is thus set at the input of the amplifier device 11, which input current is, moreover, proportional to the input voltage $U_{in}$. The input impedance $Z_{in}$, which is then finite and real, is calculated taking account of the gain V in accordance with equation (1) as:

$$Z_{in} = Z5 \cdot \frac{Z7}{Z6} \cdot \frac{1}{V-1} \quad (3)$$

In order to introduce as little thermal noise as possible, it is favorable for either the two INIC impedances Z6 and Z6 or the two INIC impedances Z6 and Z7 to be dimensioned in a complex fashion, in particular purely capacitively. This results in the first negative feedback path 30 having only a very small noise contribution. In addition, the frequency responses of the two capacitively chosen INIC impedances Z5 and Z6 or Z6 and Z7 cancel one another out again on account of the ratio formation which is evident from equation (3).

Figure 3:
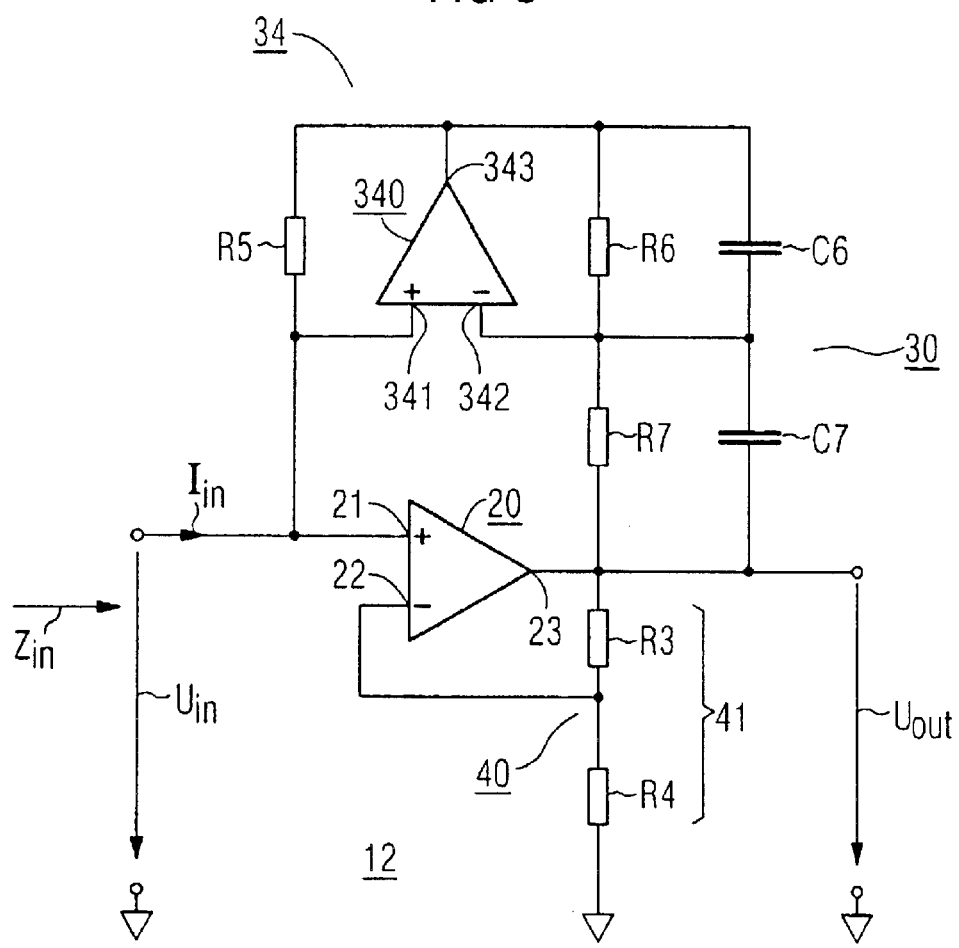
FIG. 3 shows an exemplary embodiment of the amplifier device of FIG. 2.

FIG. 3 shows an amplifier device 12 representing a concrete example of the realization of the amplifier device 11 of FIG. 2. The first INIC impedance Z5 is designed as a purely non-reactive first INIC resistor R5. The second and third INIC impedances Z6 and Z7, respectively, are in each case embodied as a parallel circuit formed by a second non-reactive INIC resistor R6 and a first INIC capacitor C6 and, respectively, a third non-reactive INIC resistor R7 and a second INIC capacitor C7. The two non-reactive INIC resistors R6 and R7 serve for DC voltage negative feedback. However, their value may be chosen to be so high that their noise contribution is short-circuited by the two INIC capacitors C6 and C7, respectively, in the desired frequency range. The in this case purely resistive voltage divider 41 contains a first and a second non-reactive divider resistor R3 and R4, respectively.

The two amplifier elements 20 and 340 are each embodied as operational amplifiers which are designed in accordance with the required inherent noise and in accordance with the required bandwidth. The first INIC resistor R5 assumes a value of 1.4 kΩ, the second INIC resistor R6 a value of 70 kΩ, the third INIC resistor R7 a value of 10 kΩ, the first INIC capacitor C6 a value of 20 pF, the second INIC capacitor C7 a value of 140 pF and the two non-reactive divider resistors R3 and R4 a value of 1 kΩ in each case. A real input impedance $Z_{in}$ of 200Ω is thus obtained, which, consequently, is very well matched to a customary source resistance $R_q$ of an ultrasonic transducer which is connected upstream of the amplifier device 12 but is not illustrated in FIG. 3. Moreover, the amplifier device 12 can be operated in a frequency range of from 0.5 to 20 MHz. It is thus suitable for different ultrasonic transducers having, in particular, different center frequencies in the frequency range mentioned.

Furthermore, the amplifier device 12 is also distinguished by a very good noise behavior in the frequency range mentioned. This can be seen in the course of investigating the noise contribution of the two non-reactive divider resistors R3 and R4 in the output voltage $U_{out}$. A noise contribution which is proportional to $$\frac{V-2}{2(V-1)} \text{ and } 1 - \frac{V}{2} \quad (4)$$

results for the two divider resistors R3 and R4, respectively. It is evident from this that both noise contributions each tend toward zero if the gain V in accordance with equation (1) assumes the value 2, that is to say if the two divider impedances Z3 and Z4 which are designed here as purely non-reactive divider resistors R3 and R4 are chosen to have identical magnitudes. In that case, the requirement—established in connection with equation (2)—for the smallest possible non-reactive divider resistors R3 and R4 also need no longer be taken into account. As long as the condition R3=R4 is met, the two non-reactive divider resistors R3 and R4 can assume a value which is upwardly unlimited in principle, with the result that the current flow in the second negative feedback path 40 can be kept small without difficulty. This results not only in a real input impedance $Z_{in}$ and little inherent noise but also in a low power consumption and little signal distortion.

The negative feedback via the current-inverting negative impedance converter 34 in the first negative feedback path 30 renders the noise of the two non-reactive divider resistors R3 and R4 ineffective for the case where the gain is V=2. This is because each voltage source connected in series with the first and second input 21 and 22, respectively, of the first amplifier element 20 is suppressed at the first output 23. Since the inherent voltage noise of the first amplifier element 20 is described precisely by a respective equivalent voltage noise source connected in series with one of the two inputs 21 and 22, no noise component caused by the first amplifier element 20 therefore appears at the output 23. However, it is favorable when this suppression at the output 23 does not apply to the input voltage $U_{in}$ to be amplified, since it is not connected in series but rather in parallel with the first input 21.

Figure 4:
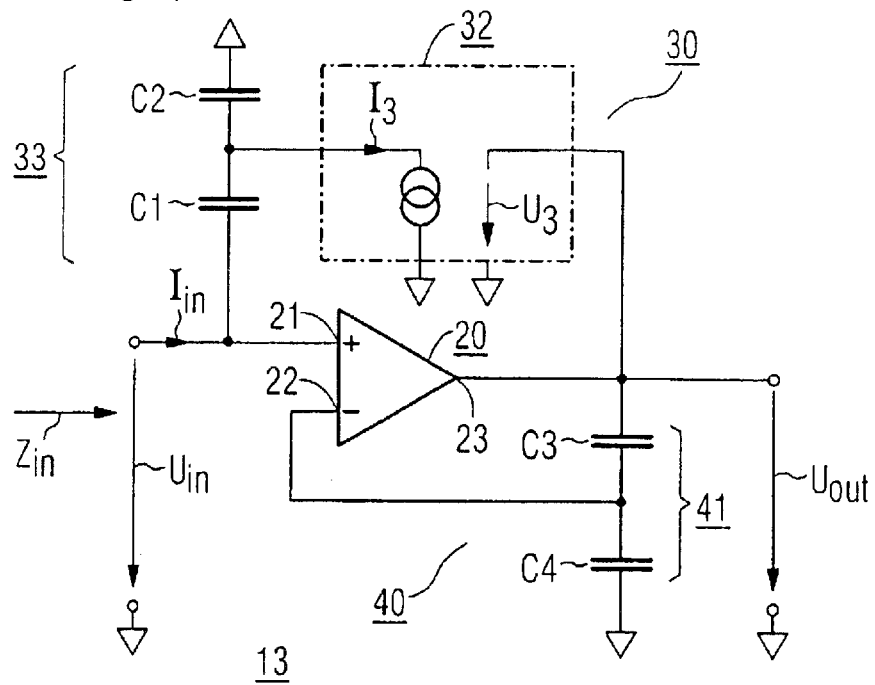
FIG. 4 shows an amplifier device having negative feedback via a voltage-controlled current source.

FIG. 4 represents a further amplifier device 13, which contains, in the first negative feedback path 30, a voltage-controlled current source instead of the current-controlled current source used in the amplifier devices 11 and 12. In this case, an input voltage U3 leads to a proportional output current I3. The output voltage $U_{out}$ of the amplifier device 13 serves as the input voltage U3. The voltage-controlled current source 32 is connected to the input of the amplifier device 13 via a first divider capacitor C1 of a voltage divider 33, which additionally contains a second divider capacitor C2. A finite input current $I_{in}$ therefore appears at the input of the amplifier device 13, which input current is also proportional to the input voltage $U_{in}$ on account of the proportionality relationships between $U_{in}$ and $U_{out}$ (see equation (1)), between $U_{out}$ and U3 and between U3 and I3 and also in accordance with the divider ratio chosen for the voltage divider 33. A desired real value can thus be set for the input impedance $Z_{in}$ by way of the dimensioning of said proportionality relationships and of said divider ratio.

Since the voltage divider 41 comprises a third and a fourth divider capacitor C3 and C4, respectively, and is thus designed purely capacitively exactly like the voltage divider 33, the amplifier device 13 is also distinguished by a good noise behavior. Thermal noise does not occur.

The amplifier device 13 is additionally suitable for broadband use since only the respective divider ratios influence the response and the frequency dependencies of the divider capacitors C1 to C4 thus compensate for one another. A bandwidth of at least two decades can thus readily be achieved.

Figure 5:
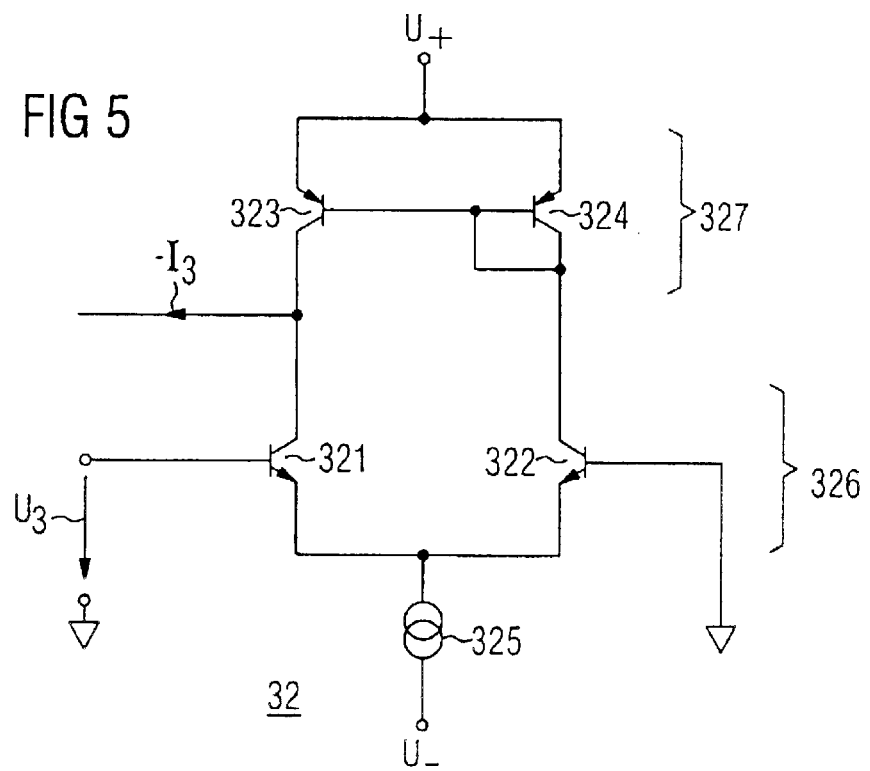
FIG. 5 shows a voltage-controlled current source.

This is because the voltage-controlled current source 32 can also be embodied in a both broadband and low-noise fashion. A corresponding realization example is shown in FIG. 5. The voltage-controlled current source contains a differential amplifier 326 formed by two bipolar npn transistors 321 and 322, and a current mirror 327 formed by two bipolar pnp transistors 323 and 324. The current mirror 327 compels an identical current flow at the collector terminals of the transistors 323 and 324 of the differential amplifier 326. A current difference between the current flow at the collector terminal of the transistor 321 and the current flow at the collector terminal of the transistor 322 is consequently precisely equal to the output current I3. A bias current source 325 connected to the emitter terminals of the transistors 321 and 322 provides for a constant current flow via the differential amplifier 326. If appropriate, in order to improve the linearity, the emitter terminals of the transistors 321 and 322 may also be connected to the bias current source 325 via a respective non-reactive resistor. The voltage-controlled current source 32 is fed by means of a positive and a negative supply voltage $U_+$ and $U_-$, respectively.

A voltage change in the input voltage U3 at the base terminal of the transistor 321 leads to a corresponding output current I3 on account of the current equality compelled by the current mirror 327 at the collector terminals of the transistors 322 and 323. The voltage-controlled current source 32 shown in FIG. 5 can be embodied in a both broadband and low-noise fashion by suitable selection of the transistors 321 to 324. In addition, the voltage-controlled current source 32 is very well suited to integration. The preconditions for use in the amplifier device 13 of FIG. 4 are thus given.

FIGS. 6 to 9 illustrate amplifier devices 14 to 17 having only a first negative feedback path 30. The favorable effect on the noise contribution and the setting of a finite input impedance is provided in these exemplary embodiments, too. As in the example of FIG. 4, the negative feedback is respectively effected via the capacitive voltage divider 33 and a voltage-controlled current source 32 or 32a. The second negative feedback path can be omitted in the amplifier devices 14 to 17. A respective amplifier element 50 and 60 is used which has an input resistance that is larger by about at least two orders of magnitude compared with the input impedance $Z_{in}$ of the respective amplifier device 14 to 17, and a finite gain that can be set by way of the choice of operating point.

Therein lies a difference relative to the amplifier devices 10 to 13, in which the amplifier element 20 is in each case embodied as an (ideal) operational amplifier with a then at least theoretically infinite gain. In the amplifier element 20, the negative feedback via the second negative feedback path 40 also serves, inter alia, for setting a finite gain (see equation (1)). This is not necessary, however, in the amplifier elements 50 and 60.

Figure 6:
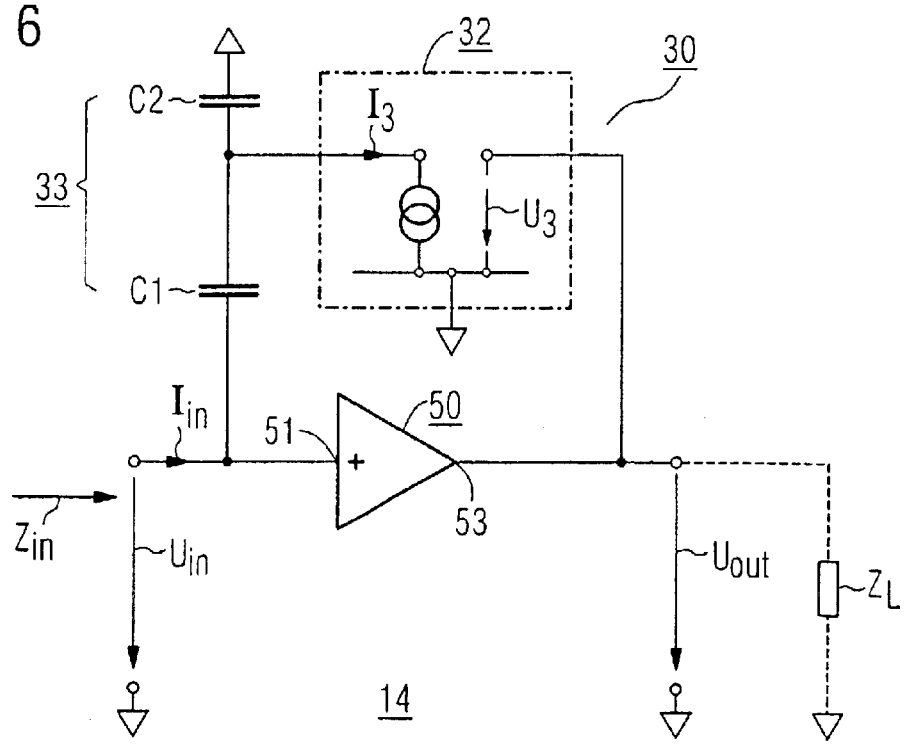
FIG. 6 shows an amplifier device having a non-inverting amplifier element and negative feedback via a voltage-controlled current source.

In the amplifier device 14 of FIG. 6, the amplifier element 50 is embodied in non-inverting fashion. This means that the voltage at the first (and here sole) input 51 of the amplifier element 50 has the same polarity as the voltage at the output 53 of the amplifier element 50. The phase rotation by 180° which is required for a negative feedback is then effected in the negative feedback path 30.

Figure 7:
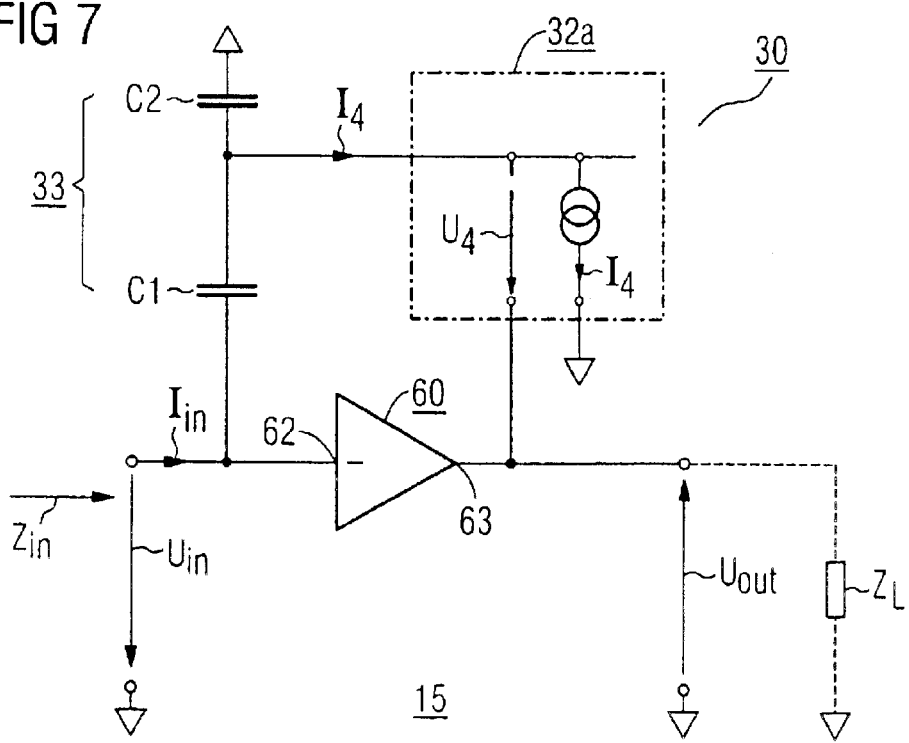
FIGS. 7 and 8 show amplifier devices having an inverting amplifier element and negative feedback via a voltage-controlled current source.

By contrast, in the further amplifier device 15 of FIG. 7, the amplifier element 60 is embodied in inverting fashion. The voltage at the first input 62 then has precisely the opposite polarity to the voltage at the output 63. The output voltage $U_{out}$ of the amplifier device 15 is also accordingly present with opposite polarity (also see associated directional arrow in FIG. 7). The voltage-controlled current source 32a provided here does not effect a further rotation of the polarity by 180°. The 180° phase condition for the negative feedback is already fulfilled here by the inverting amplifier element 60. The input voltage of the voltage-controlled current source 32a is designated by U4 and the output current by I4. In the example of FIG. 7, the output 63 of the amplifier element 60 is at the same time also the output of the amplifier device 15. Thus, a load impedance $Z_L$ would then be connected directly to the output 63.

Figure 8:
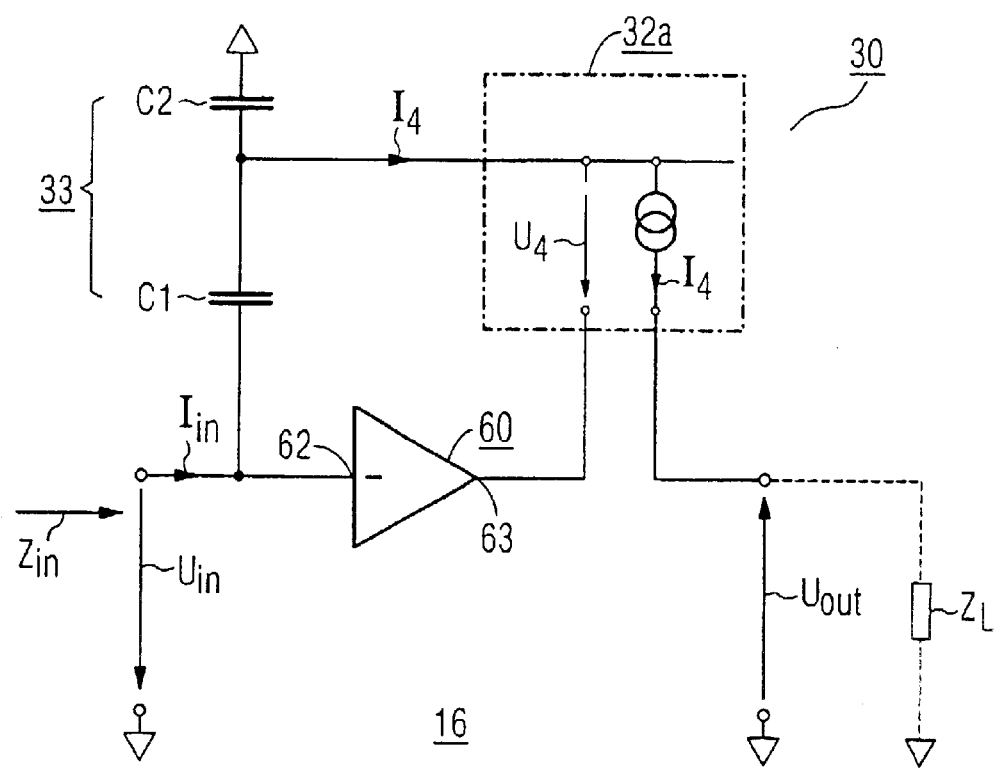

However, in accordance with FIG. 8, there is also another amplifier device 16, in which the load $Z_L$ is connected to the voltage-controlled current source 32a. The current I4 then also flows via the load $Z_L$. This variant is distinguished in particular by the fact that the input voltage $U_{in}$, in addition to being amplified by the amplifier element 60, is also amplified, at least to a certain extent, by the voltage-controlled current source 32a. The output voltage $U_{out}$ is thus present in doubly amplified form.

Figure 9:
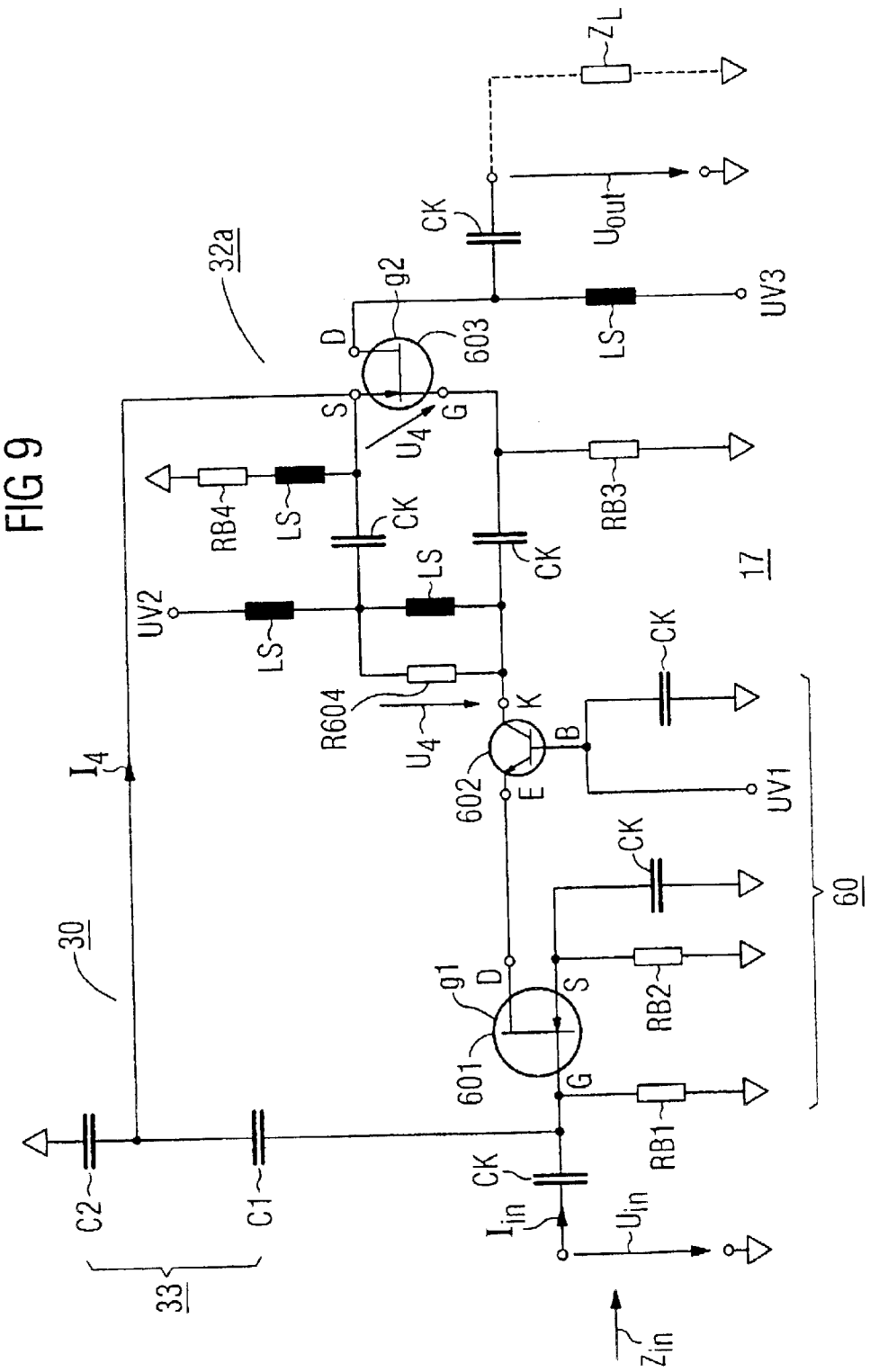
FIG. 9 shows an exemplary embodiment of the amplifier device of FIG. 8.

FIG. 9 illustrates a more concrete exemplary embodiment of the amplifier device 16 of FIG. 8. In the amplifier device 17 shown, the amplifier element 60 is designed as a so-called cascode amplifier having a field-effect transistor (FET) 601 and an npn transistor 602. The FET 601 effects a phase rotation by 180°, whereas the npn transistor 602 does not alter the phase. The input voltage U4 of the voltage-controlled current source 32a, which contains a field-effect transistor (FET) 603 as key component, is dropped across an output resistor R604 of the amplifier element 60. The FETs 601 and 603 each have a source terminal, a drain terminal and gate terminal, designated by S, D and G, respectively. g1 and g2 designate the respective so-called transconductance of the FETs 601 and 603. The npn transistor 602 has an emitter terminal, a collector terminal and a base terminal, designated by E, K and B respectively. The output current I4—also flowing via the load $Z_L$—of the voltage-controlled current source 32a results, in terms of magnitude, as:

$$|I4| = \left|U4 \cdot \left(g2 + \frac{1}{R604}\right)\right| = |U_{in} \cdot g1 \cdot (1 + g2 \cdot R604)| \quad (5)$$

where $$|U4| = |U_{in} \cdot g1 \cdot R604| \quad (6)$$

As already discussed above in connection with FIG. 8, the voltage gain V of the entire amplifier device 17 is determined both by the transconductance g1 of the amplifier element 60 and by the transconductance g2 of the voltage-controlled current source 32a:

$$|V| = \left|\frac{U_{out}}{U_{in}}\right| = \left|\frac{I4 \cdot ZL}{U_{in}}\right| = |ZL \cdot g1 \cdot (1 + g2 \cdot R604)| \quad (7)$$

The amplifier device 17 can be designed in particular for radio-frequency signal frequencies of the input voltage $U_{in}$ of between 5 and 125 MHz. A typical center or main value of the signal frequency is about 65 MHz, for example. At these high frequencies, the coupling capacitances designated by CK in each case practically constitute an electrical short circuit and the locking inductances (=inductor coils) designated by LS in each case practically constitute an electrical open circuit. The supply voltages UV1, UV2 and UV3 and the bias resistors RB1, RB2, RB3 and RB4 essentially serve for setting the operating point of the FETs 601 and 603 and of the npn transistor 602. In the exemplary embodiment of FIG. 9, the value of RB1 and of RB3 is 100 kΩ in each case, the value of RB2 and RB4 is 75Ω in each case, and the value of R604 is 2.7 kΩ. By way of example, an FSC60ML from the company Fujitsu and BF999 from the company Infineon are used as FETs 601 and 603, respectively, and a BFR183 from the company Infineon is used as the npn transistor 602.

The amplifier device 17 is provided in particular as a radio-frequency (pre-)amplifier of a magnetic resonance apparatus (not illustrated). The input impedance of such a magnetic resonance apparatus then represents the load $Z_L$. By means of the amplifier device 17, a real input impedance $Z_{in}$ of a few ohms, in particular of about 10 to 50Ω, can be established in a low-noise manner.

I claim:

1. A low-noise radio-frequency amplifier device, comprising:

an amplifier element having at least one input and an output;

a negative feedback path from said output to said input for receiving an input current fed into the axnplifier device; and a controlled current source and a voltage divider connected in said negative feedback path, said voltage divider including a series circuit formed by a first and a second divider capacitor;

a connection between said controlled current source and said voltage divider being provided between said first and second divider capacitors.

2. The amplifier device according to claim 1, wherein said controlled current source is a voltage-controlled current source.

3. The amplifier device according to claim 1, wherein said voltage divider is a purely capacitive voltage divider.

4. The amplifier device according to claim 1, wherein said controlled current source contains a differential amplifier.

5. The amplifier device according to claim 1, wherein said controlled current source contains a current mirror.

6. The amplifier device according to claim 1, wherein said controlled current source contains a field effect transistor.

7. The amplifier device according to claim 1, wherein said controlled current source is a current-inverting negative impedance converter.

8. The amplifier device according to claim 7, wherein said amplifier element is a first amplifier element having a first input and a second input, said current-inverting negative impedance converter includes a second amplifier element having a third inputs a fourth input, and an output connected back to said third and fourth inputs of said second amplifier element.

9. The amplifier device according to claim 1, wherein said amplifier element contains at least one transistor.

10. The amplifier device according to claim 1, which comprises an input having a finite real input impedance.

11. The amplifier device according to claim 1, wherein an amplifier input has a finite real input impedance of 10Ω or of 200Ω.

12. In an ultrasonic apparatus, the amplifier device according to claim 1.

13. In a magnetic resonance apparatus, the amplifier device according to claim 1.

14. In combination with a radio-frequency measuring apparatus, the amplifier device according to claim 1.

15. A method of using a low-noise radio-frequency amplifier, which comprises:

providing a low-noise radio-frequency amplifier device having:

an amplifier element having at least one input and an output;

a negative feed-back path from said output to said input for receiving an input current fed into the amplifier device; and a controlled current source and a voltage divider connected in said negative feedback path, said voltage divider including a series circuit formed by a first and a second divider capacitor;

a connection between said controlled current source and said voltage divider being provided between said first and second divider capacitors; and using the low-noise radio-frequency amplifier device to amplify a radio-frequency signal of an apparatus selected from the group consisting of an ultrasonic apparatus, a magnetic resonance apparatus, and a radio-frequency measuring apparatus.

* * * * *